(12) United States Patent
Yoon

(10) Patent No.: US 6,778,922 B2
(45) Date of Patent: Aug. 17, 2004

(54) DECODER FOR THREE PHASE SIGNAL

(75) Inventor: Inwoo Yoon, Overland Park, KS (US)

(73) Assignee: Honeywell International Inc., Morristown, NJ (US)

(*) Notice: Subject to any disclaimer, the term of this patent is extended or adjusted under 35 U.S.C. 154(b) by 155 days.

(21) Appl. No.: 10/121,890

(22) Filed: Apr. 11, 2002

(65) Prior Publication Data

US 2002/0173932 A1 Nov. 21, 2002

Related U.S. Application Data

(60) Provisional application No. 60/283,255, filed on Apr. 11, 2001.

(51) Int. Cl.[7] .......................... G01R 13/00; H03M 1/48

(52) U.S. Cl. .......................... 702/72; 341/116; 341/117

(58) Field of Search .............................. 702/66, 71, 72; 341/112, 115, 116, 117; 318/138, 254, 439, 638, 652, 661, 656

(56) References Cited

U.S. PATENT DOCUMENTS 5,345,156 A * 9/1994 Moreira ...................... 318/254
5,783,917 A * 7/1998 Takekawa ................... 318/439

* cited by examiner

Primary Examiner—John Barlow
Assistant Examiner—Meagan S Walling

(57) ABSTRACT

A heading and Omni-Bearing Selector (OBS) module for converting 3-phase analog heading signals input from a heading synchronic device and analog sine and cosine bearing signals input from an OBS resolver device.

29 Claims, 3 Drawing Sheets

DECODER FOR THREE PHASE SIGNAL

This application claims the benefit of U.S. Provisional Application Ser. No. 60/283,255, filed in the name of Inwoo Yoon on Apr. 11, 2001, the complete disclosure of which is incorporated herein by reference.

FIELD OF THE INVENTION

The present invention relates to three-phase signal decoder devices and methods, and in particular to devices and methods for decoding a three-phase analog heading signal in an electronic navigation system.

BACKGROUND OF THE INVENTION

In modern electronic navigation systems, host-ship heading information and bearing information relative to a radio navigation aid is typically conveyed through an analog synchronic repeater device and converted into a digital signal for use by the navigation system. In typical avionics navigation systems, a synchronic heading and Omni-Bearing Selector (OBS) module takes the synchronic heading and OBS resolver analog inputs and converts them to digital values for use by the main processor. Accurate conversion of the information is very important for safe navigation of the aircraft.

The OBS resolver outputs analog sine and cosine values directly.

As illustrated in FIG. 1, the heading synchronic device 1 is a 3-wire device driven by a 400 Hz excitation signal. The heading synchronic device 1 generates a 3-phase signal through three equally spaced stator windings 2, 3, 4 in the synchro body. The phase difference between any of two signals is a fixed value, typically 120 degrees. The heading and OBS module uses this information to generate two heading signals corresponding to the sine and cosine of the relative position of a rotor 5. Conditioning of the 3-phase signal requires resolving the cosine and sine angles between the analog inputs.

Traditionally, the heading synchronic signal $\theta$ is partially resolved using the Scott-T transformer 7. FIG. 2 illustrates a synchronic heading and OBS module 6 in which conditioning of the 3-phase signal is accomplished using a Scott-T transformer 7. Each leg of the Scott-T transformer 7 takes two input voltages and outputs an analog voltage used to calculate the angle, which in turn corresponds to an instrument heading or bearing angle. Accordingly, measuring across the $S_1$, $S_2$ terminals of the heading synchronic device 1 generates a first voltage:

$$V_1 = \sin(\omega t) * \sin(\theta). \quad \text{(Eq. 1)}$$

The Scott-T transformer 7 takes as inputs the $S_2$, $S_3$ terminals of the heading synchronic device 1 generates a second voltage:

$$V_2 = \sin(\omega t) * \sin(\theta + 120), \quad \text{(Eq. 2)}$$

where: $\omega t$ is the 400 Hz excitation signal. Using these two values, the Scott-T transformer 7 generates $\cos(\theta)$ in hardware.

The processor 8 must compute the arctangent of the angle derived from these two input voltage signals to generate the heading synchro angle $\theta$, according to the following:

$$\theta = \tan^{-1}\left(V_1 * \frac{\sin(120)}{(V_2 - V_1 * \cos(120))}\right). \quad \text{(Eq. 3)}$$

Because $\sin(120)$ and $\cos(120)$ are constants, Eq. 1 reduces to:

$$\theta = \tan^{-1}\left(\frac{\sqrt{3}}{2} * \frac{V_1}{(V_2 + 0.5V_1)}\right). \quad \text{(Eq. 4)}$$

The Scott-T transformer 7 thus mechanizes a portion of the arctangent function in hardware, but the processor 8 must take as input the value of $V_1$ and the value output by the Scott-T transformer 7 through separate analog-to-digital (A/D) converters 9, 10, and operate the arctangent Eq. 4 to generate the synchro angle $\theta$ from the derived signals.

Scott-T transformer is a complicated and expensive device. Furthermore, although effective for generating the signals used to generate the synchro angle $\theta$, the processor 8 must still be used to generate the heading synchro angle $\theta$.

SUMMARY OF THE INVENTION

The present invention provides an accurate and economic apparatus and method for determining heading synchronic and OBS resolver values by operating a computer processor that is structured to receive an output of A/D conversion circuitry and a digital reference waveform input, the computer processor being structured to operate an algorithm for converting the output of the A/D conversion circuitry to a heading angle.

According to one embodiment of the invention, a device is provided for converting 3-phase analog signals to digital angles, the device having a first and a second differential amplifier, the first differential amplifier being coupled to receive and compare a first and a second of the 3-phase analog signals, and the second differential amplifier being coupled to receive the second and a third of the 3-phase analog signals; analog-to-digital (A/D) conversion circuitry coupled to receive an output of the first and second differential amplifiers; and the computer processor structured to receive an output of the A/D conversion circuitry and a digital reference waveform input, the computer processor being structured to operate an algorithm for converting the output of the A/D conversion circuitry to an angle.

According to one embodiment of the invention, the device further includes an Omni-Bearing Selector (OBS) portion that is structured to receive analog sine and cosine inputs of an OBS resolver and is coupled to the processor for converting bearing information relative to a radio navigation aid, the processor having installed thereon an algorithms for converting the OBS sine and cosine inputs to a bearing angle. The OBS portion further includes first and second differential amplifiers coupled to amplify sine and cosine output signals, and a drive signal that is one of a drive signal generated by the processor and a drive signal generated by the digital reference waveform.

According to one embodiment of the invention, the invention provides a heading and Omni-Bearing Selector (OBS) module for converting 3-phase analog heading signals input from a heading synchronic device and analog sine and cosine bearing signals input from an OBS resolver device, the heading and OBS module having (a) a processor; (b) a heading signal converting portion formed of: i) first and second differential amplifiers structured to compare first and second input analog signals, the first input differential amplifier being structured to receive first and second analog output voltage signals from a 3-phase heading synchronic device, and the second input differential amplifier being structured to receive second and third analog output voltage signals from the 3-phase heading synchronic device, ii) a first analog-to-digital (A/D) converter coupled between the first differential amplifier and the processor to receive an output of the first differential amplifier and input the output to the processor, iii) a second analog-to-digital (A/D) converter coupled between the second differential amplifier and the processor to receive an output of the second differential amplifier and input the output to the processor, and iv) software resident on the processor for converting the outputs of the first and second differential amplifiers to an angle representative of heading; and (c) an OBS signal converting portion for converting analog sine and cosine signals from an OBS resolver device, the OBS signal converting portion formed of: i) an OBS drive signal, ii) first and second differential amplifiers coupled to receive respective analog sine and cosine signals from an OBS resolver device and output respective amplified analog sine and cosine signals, iii) first and second analog-to-digital (A/D) converters coupled to receive the output of the respective first and second differential amplifiers, and iv) software resident on the processor for converting the outputs of the first and second differential amplifiers to an angle representative of bearing.

According to one aspect of the invention, the processor of the heading and OBS module includes the first and second analog-to-digital (A/D) converters.

According to another aspect of the invention, the processor is further structured to operate under the control of a digital reference waveform input signal.

According to another aspect of the invention, the OBS drive signal is one of a drive signal generated by the processor and a drive signal generated by the digital reference waveform.

According to still another aspect of the invention, the processor is a Microchip PIC16C77X series-type processor, for example but not limited to the Microchip PIC16C773 processor, or another processor that is equivalent thereto.

According to still other aspects of the invention, the invention provides methods for converting 3-phase analog heading signals input from a heading synchronic device to a signal representing the heading angle and methods for converting input analog sine and cosine bearing angle signals from an Omni-Bearing Selector device to a signal representing the bearing angle.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for accurately and economically determining heading synchronic and OBS resolver values by accurately transforming synchronic repeater information.

The invention digitally performs the input voltage conversion previously accomplished by the Scott-T transformer, and ensures highly accurate results by synchronizing the signals with a digital reference waveform. The reference waveform allows signal conversion only at useable portions of the signal waveform. The apparatus is comprised of differential amplifier components to compare two analog signals, analog-to-digital conversion circuitry and a computer processing unit, controlled by the digital reference waveform input.

Figure 2:
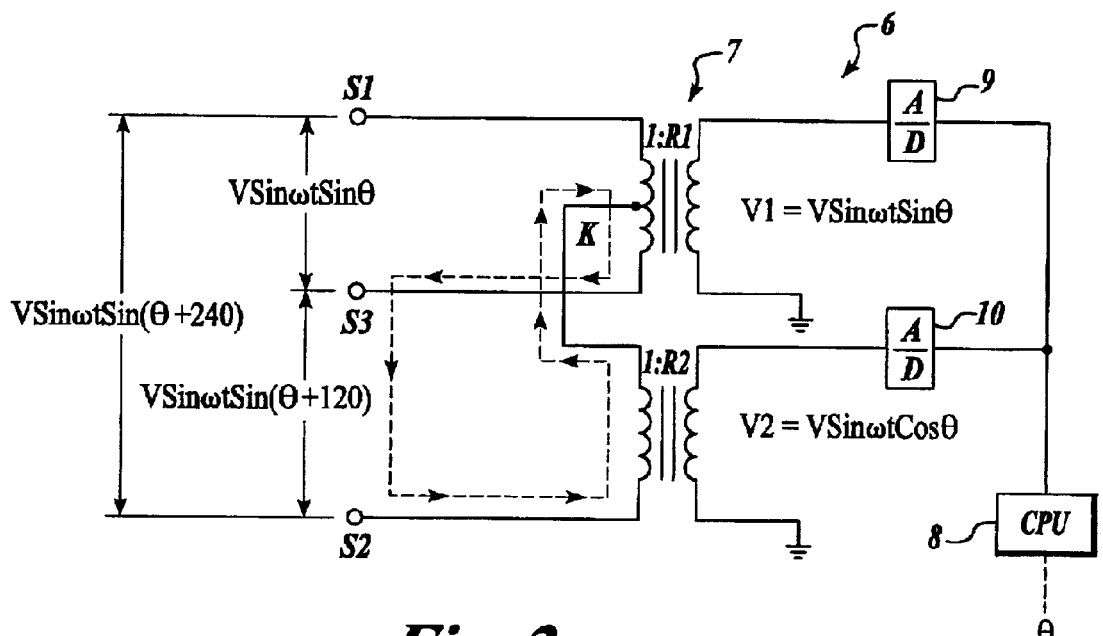
FIG. 2 is an illustration of a known synchronic heading and OBS module in which conditioning of the 3-phase heading signal is accomplished using a Scott-T transformer.

As discussed above, the processor 8 portion of the current synchronic heading and OBS module 6 illustrated in FIG. 2 must compute the arctangent of the angle derived from the input voltage signals to generate the heading synchro angle $\theta$ by solving for the arctangent of the angle $\theta$ according to the arctangent function shown in Eq. 2, above.

Figure 3:
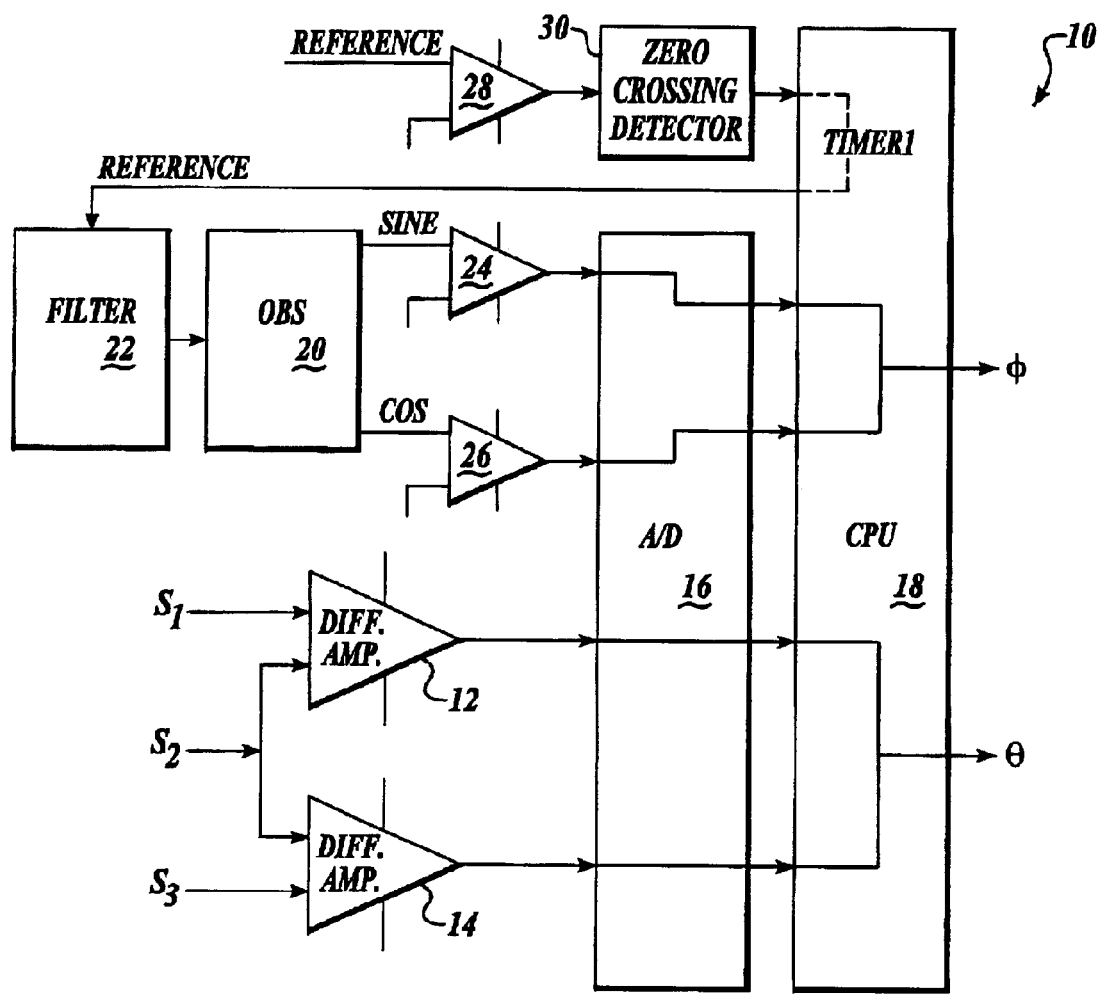
FIG. 3 is a block diagram that illustrates one exemplary embodiment of the invention that digitally performs the input voltage conversion previously accomplished by the Scott-T transformer of FIG. 2 and ensures highly accurate results by synchronizing the analog heading input signals with a reference waveform.

FIG. 3 is a block diagram that illustrates one exemplary embodiment of the invention that digitally performs the input voltage conversion previously accomplished by the Scott-T transformer 7 (FIG. 2) and ensures highly accurate results by synchronizing the analog heading input signals with a reference waveform, which is used as a timing guide. The reference waveform permits signal conversion only at useable portions of the signal waveform. In FIG. 3, the apparatus of the invention is embodied as an analog to digital synchronic repeater device 10 that operates as a novel synchronic heading and OBS module.

As embodied in FIG. 3, the analog to digital synchronic repeater device 10 of the invention is formed of differential amplifier components 12, 14 that are used to compare two input analog signals, analog-to-digital (A/D) conversion circuitry 16, and a computer processing unit (CPU) 18 that is controlled by a digital reference waveform input. The reference waveform input is a 400 Hz sine wave provided by the host aircraft. When the device is configured as embodied in FIG. 3 to further convert sine and cosine analog inputs from an OBS resolver into a digital OBS bearing angle, an OBS drive signal for driving the OBS resolver is generated from a 400 Hz square wave, either by the processor or the reference signal for the heading.

Figure 1:
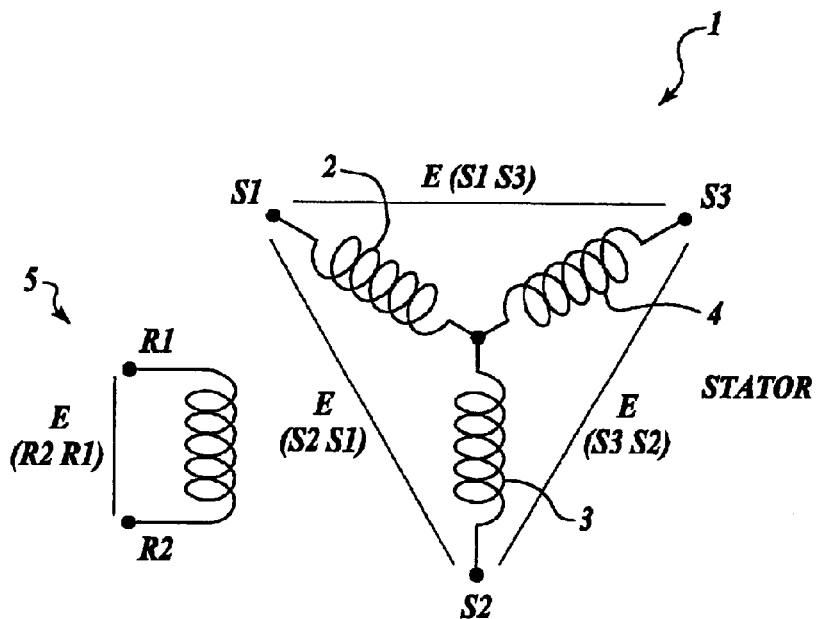
FIG. 1 is an illustration of a known 3-wire heading synchronic device.

The apparatus and method of the invention measures the voltages across two of the output three terminals of the heading synchronic device 1, illustrated in FIG. 1, and plugs the values into the arctangent function to compute the heading synchro angle $\theta$, according to Eq. 4 above. The Scott-T transformer 7 of FIG. 2 is thereby eliminated from the apparatus 10 of the invention.

The analog voltage signals across each pair of the output three terminals of the heading synchronic device 1, i.e., $S_1$, $S_2$ and $S_2$, $S_3$, are amplified by the differential amplifiers 12, 14. The differential amplifiers 12, 14 output first and second voltages $V_1$, $V_2$, where $V_1$ and $V_2$ have the values shown in respective Eq. 1 and Eq. 2, described above. The output of the differential amplifiers 12, 14 and the sine and cosine values output by the OBS resolver are analog signals input to the A/D conversion circuitry 16.

One exemplary processor for use as the processor 18 in the present invention is a Microchip PIC16C773 available from Microchip Technology Incorporated, Chandler, Arizona, and described in publication DS30275A, "PIC1677X, 28/40-Pin, 8-bit CMOS microcontrollers with 12-bit A/D, Advance Information" copyright 1999 by Microtechnology Inc., the complete disclosure of which is incorporated herein by reference. However, this processor is recited only as an example. Other suitable processors, such as another of the PIC1677X series processors, may be available from Microtechnology Inc. or other suitable processors may be available from other manufactures; all other suitable processors are considered to be equivalent for purposes of the present invention. Therefore, the reciting of this processor is not intended to limit the present invention in any way. The Microchip PIC16C773 processor contains six 12 bit A/D converter inputs and runs at up to 20 MHz. Four of the six A/D inputs are used to convert the heading synchro and OBS analog input signals into digital words. This processor is known to have high resolution A/D conversion capability. According to this exemplary embodiment of the invention, the four analog signals ($V_1$, $V_2$, OBS sine, and OBS cosine) are connected to RA0:RA3 pins of the Microchip PIC16C773, and the A/D conversion circuitry 16 is thus supplied by the processor 18.

The voltages across the terminals $S_1$ and $S_2$, and terminals $S_2$ and $S_3$ are amplified using the two differential amplifiers 12, 14. The gains of these amplifiers 12, 14 are predetermined not to exceed the input range of the A/D conversion circuitry 16. Additionally, these amplifiers 12, 14 are rail-to-rail amplifiers, which further limits the output level.

Means are provided for ensuring that the heading signals are valid. For example, voltages $V_1$ and $V_2$ are measured, and a "heading valid" signal is generated. The heading is valid when the heading valid signal is a voltage either less than 3.5 vdc or greater than 12 vdc, depending on the configuration of the aircraft. When the heading signal is OPEN, the heading signal is invalid. According to one embodiment of the invention, a limit detector having two comparators is employed to generate a logic signal HEADING_VALID from the input voltage. An offset voltage is summed with the input voltage to generate a signal that is input to the limit detector. When the line is open, the limit detector generates a logic HIGH, indicating that the heading signal is not valid. The heading valid signal may be a simpler form, such as a simple HIGH or LOW logic signal. When the invention is practiced using the Microchip PIC16C773 processor, a HIGH detected on the RB5 input pin indicates that the heading is not valid.

According to the exemplary embodiment of the invention, the analog to digital synchronic repeater device 10 of the invention is also operated to convert the OBS resolver analog input signals into digital words. The Microchip PIC16C773 processor 18 is known to have an adequate number of timers for operating the OBS resolver as well as the heading synchronic device 1.

As discussed above, the OBS resolver outputs sine and cosine values directly. The OBS portion of the synchronic repeater device 10 includes a driver signal and sine and cosine inputs from the OBS resolver. According to one embodiment of the invention, the device 10 provides the drive signal. The drive signal for the OBS resolver is generated from a 400 Hz square wave, which is generated by either the processor 18 or by the reference signal utilized in the heading portion. When the 400 Hz square wave heading reference signal is used to generate the OBS drive signal, it is filtered using a 400 Hz band pass filter.

Figure 4:
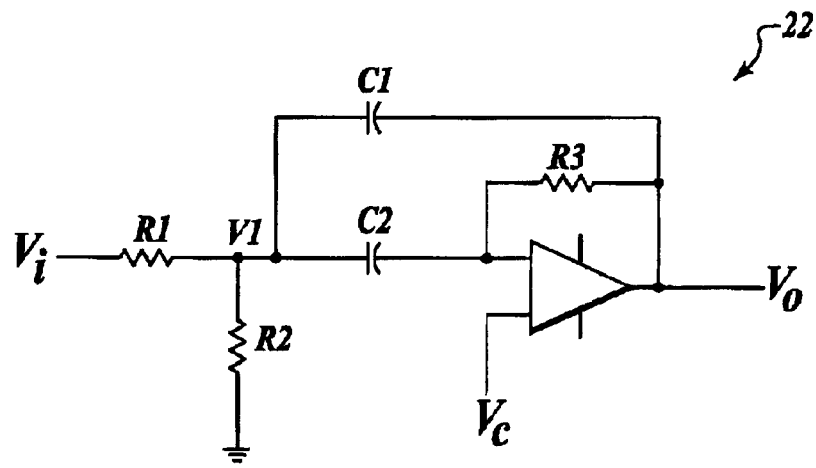
FIG. 4 illustrates one exemplary active filter implementation that may be utilized with the OBS drive of the invention.

FIG. 4 illustrates one exemplary active filter implementation 22 that may be utilized. The active filter implementation 22 having the topology and transfer function shown below. This filter topology provides easily determine gain and bandwidth as compared to other filters. The filter transfer function is given by:

$$H(s) = \frac{-\frac{1}{C_1 * R_1} * s}{s^2 + \left(\frac{1}{C_2 * R_3} + \frac{1}{C_1 * R_3}\right) * s + \frac{R_1 + R_2}{C_1 * C_2 * R_1 * R_2 * R_3}} \quad \text{(Eq. 5)}$$

The filter component values are easily determined by setting the values $C_1$ and $C_2$ to a known common value. According to one exemplary embodiment of the band pass filter, a common value of 0.1 $\mu$F is selected for $C_1$ and $C_2$. Additional filter component values can be calculated according to:

$$R_1 = \frac{Q}{\text{Gain} * C_1 * \omega_p} \quad \text{(Eq. 6)}$$

$$R_3 = \frac{Q * (C_1 + C_2)}{\omega_p * C_1 * C_2} \quad \text{(Eq. 7)}$$

$$R_2 = \frac{R_1}{\omega_p * C_1 * C_2 * R_1 * R_3 - 1} \quad \text{(Eq. 8)}$$

where: $\omega_p = 2\pi f$(frequency); and
Q=f/bandwidth.

The above described band pass filter generates a 400 Hz sine wave of 6 vdc±10% peak amplitude. To provide the OBS drive signal, the band pass filter is driven, for example, by two-transistor output stage. The resistors in the collector circuits of the driver limit the output current for short circuit protection.

As illustrated in FIG. 3, the OBS sine and cosine output signals are amplified by differential amplifiers 22, 24 and sent to the A/D conversion circuitry 16, i.e., the A/D input of the Microchip PIC16C773 processor 18. Aside from different gain, the circuit is substantially similar to the heading synchronic portion described above. The differential amplifiers 24, 26 are, for example, rail-to-rail amplifiers used with a +5 vdc supply and ground to generate output signals that will not exceed the input range of the A/D conversion circuitry 16. The processor 18 operates known algorithms for converting the OBS sine and cosine to a bearing angle φ relative to a radio navigation aid.

The OBS reference signal is attenuated with a differential amplifier 28 and fed through a zero crossing detector 30 to generate the 400 Hz square reference wave form, which in its digital form is used as a timing guide. Because the heading synchro signals and OBS resolver signals are driven from this digital reference signal, the two signals always have a known timing relationship with the reference. This known timing relationship determines an elapsed time between a zero crossing of the reference signal and the peak of synchro signal. The signals are 400 Hz sine waves. The processor 18 waits an empirically determined precise time interval after a reference signal transition and then samples the sine wave. In practice, the sine wave is sampled every time at substantially the precise moment when the waveform reaches the peak. However, there may be several microsecond jitter, which does not strongly affect the accuracy of measured signal.

The output OBS frequency is generated by software installed on the processor 18. A first timer (Timer 1 of the Microchip PIC16C773 processor) is programmed to generate an interrupt at predetermined intervals, for example, every 1.25 ms. When an interrupt occurs, the service routine toggles the OBS reference signal (OBS_FREQ line on RC2 of the Microchip PIC16C773 processor). The interrupt service routine reloads the first timer's registers for the next interrupt.

The interrupt service routine also increments and limits the global variable 'CYCLE' at the rising edge of the reference signal (RC2). The global variable CYCLE determines the main loop computation rate for the device 10. For example, the global variable cycles through the numbers 0 through 19. In such instance, the cycle rate is reset at 20 Hz, which is the main loop computation rate of the device 10.

Operation

According to one embodiment of the invention, the device 10 functions as follows. Upon reset, the first timer, Timer 1, is programmed to generate an 800 Hz interrupt. This interrupt signal is used to generate the OBS drive signal. At each interrupt, the frequency output pin OBS_FREQ is toggled. This toggling generates the 400 Hz square wave for the OBS drive signal.

All other operations are initialized, including the A/D conversion circuitry 16, an interconnected I²C bus and the interrupt service routines.

Regular interrupt occurs at an 800 Hz rate triggered by the first timer. Upon this interrupt, the processor 18 toggles the OBS frequency output pin OBS_FREQ. The interrupt service routine also increments and limits the global variable CYCLE. In normal operation, the program samples the variable CYCLE set by the interrupt service routine to determine whether it is 0. If the variable CYCLE is not at 0, the main loop waits for the variable to become 0. While the variable CYCLE is 0, and for the next four cycles, data conversion occurs. In successive cycles, OBS sine, OBS cosine, Heading X and Heading Y are converted continuously in like manner and in respective order.

For example, while the variable CYCLE is 0, the routine repeatedly converts the OBS sine signal and determines the maximum and minimum values. When the variable CYCLE changes, these values are used to compute the range of the OBS sine signal. Likewise, the OBS cosine signal is converted during cycle 1, the Heading X signal is converted during cycle 2 and the Heading Y signal is converted during cycle 3. During each cycle, maximum and minimum values are determined. After the cycle, actual data range of the signal is computed using these values. When a maximum value is detected during the cycle, status of the OBS_FREQ signal is saved for OBS data, and a status of the heading reference signal, HEADING_REF, is saved for heading data. These status values provide means for determining polarity of the data after subtracting the minimum value from the maximum value.

During cycles 2 and 3 the processor 18 operates the means for ensuring that the heading signals are valid. If the "heading valid" signal is LOW, the processor 18 detects the LOW and the heading data are converted during cycles 2 and 3. However, if for example, the "heading valid" signal is HIGH, then the processor detects the high and determines that the heading is invalid. The heading data are not converted. Rather, the processor does not go through cycles 2 and 3, and instead enters the computation phase of the operation.

After all valid data are read in, the computation phase begins. If the heading signals are not valid, heading is not computed. The computation routine generates the angle values according to known algorithms and formats and stores them for transmission by an I²C interface to the I²C bus (not shown). The industry standard I²C interface is used to communicate with the main processor (not shown). The service routine provides transmission of data to the main processor.

The analog input data are sampled for a full 360 degrees so that maximum and minimum values are obtained. However, actual peak values can be missed as a function of the sampling interval.

An analysis of error resulting from sampling interval follows. Each A/D conversion takes about 56.2 μs according to a simulation of the exemplary embodiment. This conversion time results in maximum number of 44.5 samples in a 360 degree cycle. Thus, the samples are taken at about 8 degree intervals. Considering the worst case wherein the peak of the sine signal occurs at exactly the time the signal is sampled, and the peak of the cosine signal occur at exactly halfway between two successive samples, the sampled value of the cosine signal is lower than the actual value by a factor of cosine of 4 degrees. Analysis of all angles between 0 and 90 degrees reveals a peak error occurring at 45 degrees, the peak error value being 0.0730. Thus, the peak error value is only 7.3% of 1 degree, which is the error budget of 1 degree for one known synchronic heading and OBS module currently in production by Honeywell International, Inc. A similar peak error value is obtained if cosine signal is assumed to be inaccurate.

Figure 5:
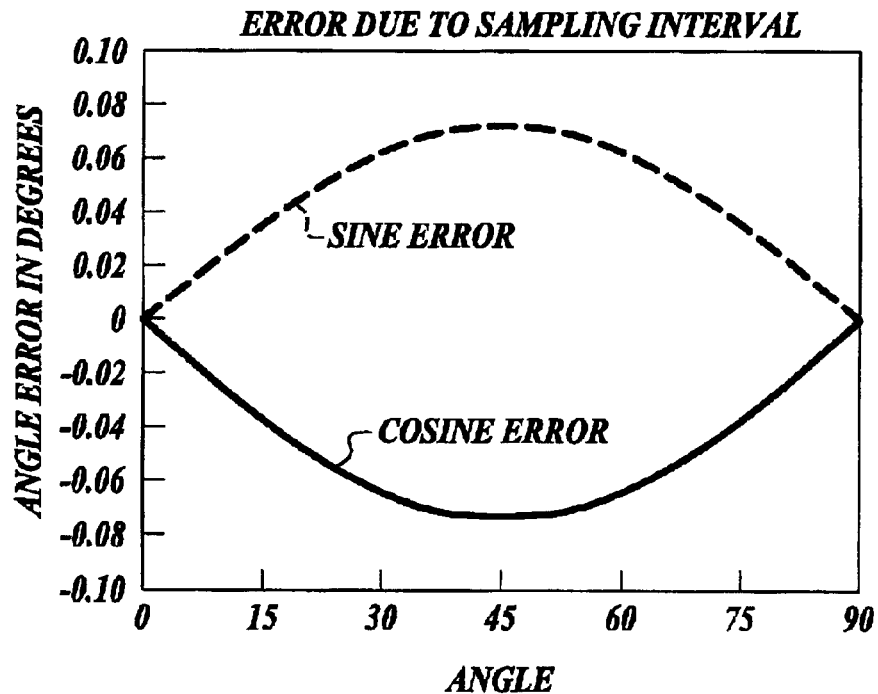
FIG. 5 is a graphic illustration of error due to sampling interval.

FIG. 5 is a graphic illustration of the error due to sampling interval. As labeled, the upper curve is the error in the sine signal, and the lower curve is the error in the cosine signal.

While the preferred embodiment of the invention has been illustrated and described, it will be appreciated that various changes can be made therein without departing from the spirit and scope of the invention.

What is claimed is:

1. A device for converting 3-phase analog signals to digital angles, the device comprising:

first and second differential amplifiers, the first differential amplifier being coupled to receive and compare a first and a second of the 3-phase analog signals, and the second differential amplifier being coupled to receive the second and a third of the 3-phase analog signals;

analog-to-digital (A/D) conversion circuitry coupled to receive an output of the first and second differential amplifiers; and a computer processor structured to receive an output of the A/D conversion circuitry and a digital reference waveform input, the computer processor being structured to operate an algorithm for converting the output of the A/D conversion circuitry to an angle, wherein the computer processor is further structured to operate the algorithm under the control of the digital reference waveform input signal.

2. The device of claim 1 wherein the reference waveform input signal is a 400 Hz sine wave.

3. The device of claim 1, further comprising an Omni-Bearing Selector (OBS) portion structured to receive analog sine and cosine inputs of an OBS resolver and coupled to the processor for converting bearing information relative to a radio navigation aid, the processor having installed thereon an algorithms for converting the OBS sine and cosine inputs to a bearing angle.

4. The device of claim 3 wherein the OBS portion further comprises first and second differential amplifiers coupled to amplify sine and cosine output signals.

5. The device of claim 4 wherein the OBS portion further comprises a drive signal that is one of a drive signal generated by the processor and a drive signal generated by the digital reference waveform.

6. The device of claim 5 wherein the processor is structured to include the A/D conversion circuitry.

7. The device of claim 4 wherein the processor is one of a Microchip PIC167C77X series processor and another processor that is equivalent thereto.

8. A heading and Omni-Bearing Selector (OBS) module for converting 3-phase analog heading signals input from a heading synchronic device and analog sine and cosine bearing signals input from an OBS resolver device, the heading and OBS module comprising:
   (a) a processor;
   (b) a heading signal converting portion, comprising:
      i) first and second differential amplifiers structured to compare first and second input analog signals, the first input differential amplifier being structured to receive first and second analog output voltage signals from a 3-phase heading synchronic device, and the second input differential amplifier being structured to receive second and third analog output voltage signals from the 3-phase heading synchronic device,
      ii) a first analog-to-digital (A/D) converter coupled between the first differential amplifier and the processor to receive an output of the differential amplifier and input the output to the processor,
      iii) a second analog-to-digital (A/D) converter coupled between the second differential amplifier and the processor to receive an output of the second differential amplifier and input the output to the processor, and
      iv) software resident on the processor for converting the outputs of the first and second differential amplifiers to an angle representative of heading; and
   (c) an OBS signal converting portion for converting analog sine and cosine signals from an OBS resolver device, the OBS signal converting portion comprising:
      i) an OBS drive signal,
      ii) first and second differential amplifiers coupled to receive respective analog sine and cosine signals from an OBS resolver device and output respective amplified analog sine and cosine signals,
      iii) first and second analog-to-digital (A/D) converters coupled to receive the output of the respective first and second differential amplifiers, and
      iv) software resident on the processor for converting the outputs of the first and second differential amplifiers to an angle representative of bearing.

9. The module of claim 8 wherein the processor further comprises the first and second analog-to-digital (A/D) converters.

10. The module of claim 9 wherein the processor is a Microchip PIC16C77X series-type processor.

11. The module of claim 8 wherein the processor is further structured to operate under the control of a digital reference waveform input signal.

12. The module of claim 11 wherein the OBS drive signal further comprises a digital drive signal that is one of a drive signal generated by the processor and a drive signal generated by the digital reference waveform.

13. A device for converting 3-phase analog heading signals input from a heading synchronic device, the device comprising:
   (a) a means for converting a 3-phase analog signal to analog signals representing sine and cosine values of a heading angle, comprising:
      i) a first means for comparing first and second input analog signals and outputting a first analog voltage signal proportional to the sine value of the heading angle,
      ii) a second means for comparing second and third input analog signals and outputting a second analog voltage signal proportional to the cosine value of the heading angle,
      iii) a first analog-to-digital signal converting means coupled for receiving an output of the first comparing means and outputting a digital signal proportional to the sine value of the heading angle,
      iv) a second analog-to-digital signal converting means coupled for receiving an output of the second comparing means and outputting a digital signal proportional to the cosine value of the heading angle; and
   (b) a first computing means coupled for receiving an output of each of the first and second analog-to-digital signal converting means and operating one or more algorithms for converting digital signals representing sine and cosine angle values to a signal representing the heading angle.

14. The device of claim 13 wherein the first and second comparing means further comprise respective first and second signal amplifying means for amplifying the respective first and second analog voltage signals.

15. The device of claim 14, further comprising processor means for operating the computing means and the first and second analog-to-digital signal converting means.

16. The device of claim 15, further comprising control means for controlling the computing means.

17. The device of claim 16 wherein the control means further comprises a digital reference waveform input signal.

18. The device of claim 13, further comprising means for determining validity of the sine and cosine values of the heading angle.

19. The device of claim 13, further comprising means for converting input analog sine and cosine bearing angle signals from an Omni-Bearing Selector device, the analog bearing angle signal converting means comprising:
   i) means for generating a Omni-Bearing Selector device drive signal,
   ii) a first and a second signal amplifying means for receiving respective analog signals representing sine and cosine values of a bearing angle and outputting respective amplified analog sine and cosine bearing angle signals,
   iii) a third and a fourth analog-to-digital signal converting means coupled for receiving an output of the respective first and second amplifying means, and
   iv) a second computing means coupled for receiving an output of each of the third and fourth analog-to-digital signal converting means and operating one or more algorithms for converting digital sine and cosine bearing angle signals to a signal representing the bearing angle.

20. A method for converting 3-phase analog heading signals input from a heading synchronic device, the method comprising:
   (a) converting a 3-phase analog signal to analog signals representing sine and cosine values of a heading angle by:
      i) comparing first and second input analog signals and outputting a first analog voltage signal proportional to the sine value of the heading angle,
      ii) comparing second and third input analog signals and outputting a second analog voltage signal proportional to the cosine value of the heading angle, iii) converting the first analog voltage signal proportional to the sine value of the heading angle to a first digital signal proportional to the sine value of the heading angle, iv) converting the second analog voltage signal proportional to the cosine value of the heading angle to a second digital signal proportional to the cosine value of the heading angle; and (b) receiving the first and second digital signals representing sine and cosine angle values and converting the first and second digital signals to a signal representing the heading angle.

21. The method of claim 20 wherein comparing first and second and second and third input analog signals and outputting a first and second analog voltage signals respectively proportional to the sine and cosine values of the heading angle further comprise amplifying the respective first and second analog voltage signals.

22. The method of claim 21, further comprising operating a processor for converting the first and second analog voltage signals to first and second digital signal and for converting the first and second digital signals to a signal representing the heading angle.

23. The method of claim 22, further comprising controlling the processor using a digital reference waveform input signal.

24. The method of claim 22, further comprising converting input analog sine and cosine bearing angle signals from an Omni-Bearing Selector device, the method of converting the analog bearing angle signal comprising:

i) generating a Omni-Bearing Selector device drive signal, ii) receiving and amplifying respective first and second analog signals representative of respective sine and cosine values of a bearing angle, iii) receiving and converting the amplified analog sine and cosine signals to respective digital sine and cosine bearing angle signals, and iv) receiving and converting the digital sine and cosine bearing angle signals to a signal representing the bearing angle.

25. The method of claim 24, further comprising operating the processor for converting the amplified analog sine and cosine signals to respective digital sine and cosine bearing angle signals and for converting the digital sine and cosine bearing angle signals to the signal representing the bearing angle.

26. The method of claim 20, further comprising determining validity of the sine and cosine values of the heading angle.

27. A device for converting 3-phase analog signals to digital angles, the device comprising:

first and second differential amplifiers, the first differential amplifier being coupled to receive and compare a first and a second of the 3-phase analog signals, and the second differential amplifier being coupled to receive the second and a third of the 3-phase analog signals;

analog-to-digital (A/D) conversion circuitry coupled to receive an output of the first and second differential amplifiers;

means for providing a digital reference waveform input signal; and means for converting the output of the A/D conversion circuitry to an angle as a function of the digital reference waveform input signal.

28. The device of claim 27 wherein the means for converting samples the output at a predetermined time after transition of the digital reference waveform input signal.

29. The device of claim 28 wherein the predetermine time corresponds substantially to an output waveform peak.

* * * * *